(12) United States Patent
Huang et al.

(10) Patent No.: US 12,120,845 B2
(45) Date of Patent: Oct. 15, 2024

(54) LIQUID-COOLING HEAT DISSIPATION PLATE WITH UNEQUAL HEIGHT PIN-FINS AND ENCLOSED LIQUID-COOLING COOLER HAVING THE SAME

(71) Applicant: AMULAIRE THERMAL TECHNOLOGY, INC., New Taipei (TW)

(72) Inventors: Yi-Hsin Huang, New Taipei (TW); Chun-Lung Wu, New Taipei (TW); Kuo-Wei Lee, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 182 days.

(21) Appl. No.: 18/147,672

(22) Filed: Dec. 28, 2022

(65) Prior Publication Data
US 2024/0224464 A1    Jul. 4, 2024

(51) Int. Cl.
*H05K 7/20* (2006.01)

(52) U.S. Cl.
CPC ..... *H05K 7/20263* (2013.01); *H05K 7/20409* (2013.01)

(58) Field of Classification Search
CPC .......... H05K 1/0201–0212; H05K 1/181–188; H05K 1/0271–0272; H05K 7/20009; H05K 7/20254; H05K 7/20263; H05K 7/20272; H05K 7/20309; H05K 7/20318; H05K 7/20336; H05K 7/2039; H05K 7/20409; H05K 7/20518; H05K 7/20772; H05K 7/208; H05K 7/20872; H05K 7/20927; H05K 2201/064;
(Continued)

(56) References Cited

U.S. PATENT DOCUMENTS 6,308,771 B1 * 10/2001 Tavassoli .................. F28F 3/02
257/722
6,724,627 B2 * 4/2004 Onizuka ............. B60R 16/0238
361/720
(Continued)

FOREIGN PATENT DOCUMENTS

CN    205430861 U    8/2016
TW    M616320 U    9/2021

*Primary Examiner* — Amir A Jalali
(74) *Attorney, Agent, or Firm* — Li & Cai Intellectual Property Office (57) ABSTRACT

A liquid-cooling heat dissipation plate with unequal height pin-fins and an enclosed liquid-cooling cooler having the same are provided. The liquid-cooling heat dissipation plate includes a heat dissipation plate body, a plurality of full-height pin-fins, and a plurality of non-full-height pin-fins. The heat dissipation plate body has a first heat dissipation surface and a second heat dissipation surface that face away from each other, the first heat dissipation surface is configured to be in contact with a plurality of heat sources, and the second heat dissipation surface is configured to be in contact with a cooling fluid. The full-height and non-full-height pin-fins are formed at the second heat dissipation surface of the heat dissipation plate body. A first heat dissipation region to an Nth heat dissipation region are defined on the heat dissipation plate body along a flowing direction of the cooling fluid.

5 Claims, 5 Drawing Sheets

(58) Field of Classification Search
CPC ...... H05K 2201/10166; H01L 21/4803; H01L 21/4882; H01L 23/3121; H01L 23/34; H01L 23/36–3675; H01L 23/4006; H01L 23/46; H01L 23/50; H01L 23/473; H01L 23/4735; H01L 23/492; H01L 25/072; H01L 25/18; H01L 25/25; F28F 3/02; F28F 3/022; F28F 3/048; F28F 13/00; F28F 13/06; F28F 21/084; F28F 21/085; F28F 2215/00; F28F 2215/0028; F28F 2215/04; F28F 2215/10; F28D 1/0316; F28D 9/0043

See application file for complete search history.

(56) References Cited

U.S. PATENT DOCUMENTS

| | | | |
|---|---|---|---|
| 10,208,621 B2 | 2/2019 | Hoefler et al. | |
| 2005/0128710 A1* | 6/2005 | Beitelmal | H05K 7/20445 |
| | | | 361/709 |
| 2010/0206537 A1* | 8/2010 | Ikeda | H01L 23/3677 |
| | | | 165/185 |
| 2010/0230805 A1* | 9/2010 | Refai-Ahmed | H01L 23/36 |
| | | | 438/107 |
| 2015/0382506 A1* | 12/2015 | Yamada | H01L 23/473 |
| | | | 361/699 |
| 2018/0024599 A1* | 1/2018 | Sakata | F28F 3/06 |
| | | | 361/679.47 |
| 2018/0259268 A1* | 9/2018 | Zhou | F28D 15/046 |
| 2020/0080796 A1* | 3/2020 | Dasgupta | F28F 7/02 |
| 2023/0200022 A1* | 6/2023 | Peng | H05K 7/203 |
| | | | 361/679.53 |
| 2024/0060729 A1* | 2/2024 | Yang | F28F 3/022 |

\* cited by examiner

LIQUID-COOLING HEAT DISSIPATION PLATE WITH UNEQUAL HEIGHT PIN-FINS AND ENCLOSED LIQUID-COOLING COOLER HAVING THE SAME

FIELD OF THE DISCLOSURE

The present disclosure relates to a liquid-cooling heat dissipation plate and a liquid-cooling cooler, and more particularly to a liquid-cooling heat dissipation plate with unequal height pin-fins and an enclosed liquid-cooling cooler having the same.

BACKGROUND OF THE DISCLOSURE

Coolers are widely used in various products. Generally, higher-end products adopt water-cooling or liquid-cooling coolers, which have advantages of quietness and a stable cooling performance compared to air-cooling coolers. However, as chips are operating on faster and faster clock speeds, a heat dissipation effect provided by existing liquid coolers is no longer fully capable of meeting heat dissipation requirements of these chips. Therefore, how heat can be more effectively dissipated via liquid-cooling technology has become an issue to be addressed in the relevant industry.

SUMMARY OF THE DISCLOSURE

In response to the above-referenced technical inadequacy, the present disclosure provides a liquid-cooling heat dissipation plate with unequal height pin-fins and an enclosed liquid-cooling cooler having the same.

In one aspect, the present disclosure provides a liquid-cooling heat dissipation plate with unequal height pin-fins. The liquid-cooling heat dissipation plate includes a heat dissipation plate body, a plurality of full-height pin-fins, and a plurality of non-full-height pin-fins. The heat dissipation plate body has a first heat dissipation surface and a second heat dissipation surface that face away from each other. The first heat dissipation surface is configured to be in contact with a plurality of heat sources, and the second heat dissipation surface is configured to be in contact with a cooling fluid. The plurality of full-height pin-fins and the plurality of non-full-height pin-fins are formed at the second heat dissipation surface of the heat dissipation plate body. A first heat dissipation region to an Nth heat dissipation region are defined on the heat dissipation plate body along a flowing direction of the cooling fluid, N is an integer greater than or equal to two, and the plurality of heat sources correspond in position to the first heat dissipation region to the Nth heat dissipation region, respectively. A ratio of the plurality of full-height pin-fins to pin-fins in a first fifty percent of heat dissipation regions from the first heat dissipation region to the Nth heat dissipation region is less than a ratio of the plurality of full-height pin-fins to pin-fins in a second fifty percent of the heat dissipation regions from the first heat dissipation region to the Nth heat dissipation region.

In another aspect, the present disclosure provides an enclosed liquid-cooling cooler. The enclosed liquid-cooling cooler includes a liquid-cooling heat dissipation plate with unequal height pin-fins and a heat dissipation base. The liquid-cooling heat dissipation plate includes a heat dissipation plate body, a plurality of full-height pin-fins, and a plurality of non-full-height pin-fins. The heat dissipation plate body has a first heat dissipation surface and a second heat dissipation surface that face away from each other. The first heat dissipation surface is configured to be in contact with a plurality of heat sources, and the second heat dissipation surface is configured to be in contact with a cooling fluid. The plurality of full-height pin-fins and the plurality of non-full-height pin-fins are formed at the second heat dissipation surface of the heat dissipation plate body. A first heat dissipation region to an Nth heat dissipation region are defined on the heat dissipation plate body along a flowing direction of the cooling fluid, N is an integer greater than or equal to two, and the plurality of heat sources correspond in position to the first heat dissipation region to the Nth heat dissipation region, respectively. A ratio of the plurality of full-height pin-fins to pin-fins in a first fifty percent of heat dissipation regions from the first heat dissipation region to the Nth heat dissipation region is less than a ratio of the plurality of full-height pin-fins to pin-fins in a second fifty percent of the heat dissipation regions from the first heat dissipation region to the Nth heat dissipation region. A groove is recessed in the heat dissipation base, the heat dissipation base is combined with the heat dissipation plate body so that a chamber is formed between the groove of the heat dissipation base and the second heat dissipation surface of the heat dissipation plate body, such that the plurality of full-height pin-fins and the plurality of non-full-height pin-fins are located in the chamber.

In certain embodiments, the plurality of full-height pin-fins, the plurality of non-full-height pin-fins, and the heat dissipation plate body are made of copper, copper alloy, aluminum, or aluminum alloy.

In certain embodiments, cross-sections of the plurality of full-height pin-fins and the plurality of non-full-height pin-fins can respectively be round-shaped, ellipse-shaped, rhombus-shaped, rectangle-shaped, drop-shaped, or wing-shaped.

In certain embodiments, a ratio of the plurality of full-height pin-fins to pin-fins in the first heat dissipation region is at least 35%, and a ratio of the plurality of full-height pin-fins to pin-fins in the Nth heat dissipation region is at least 95%.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
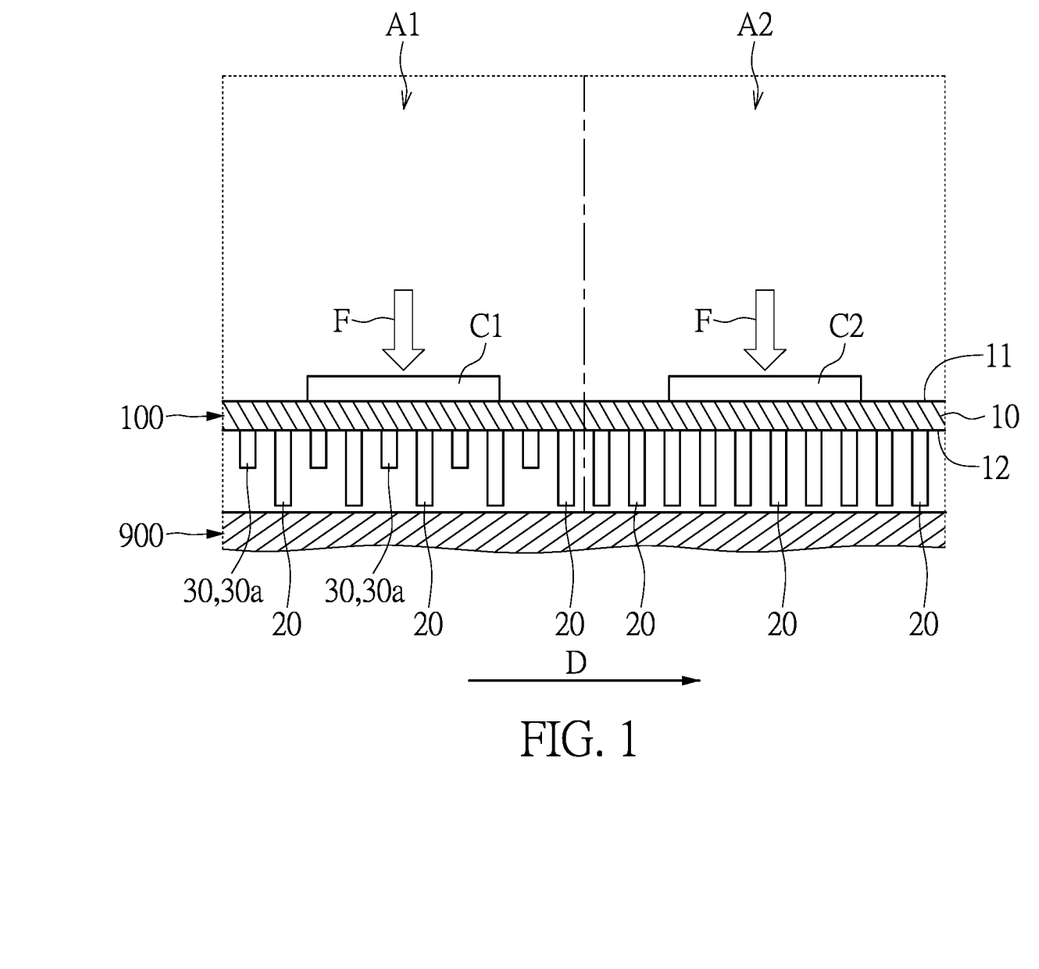
FIG. 1 is a schematic side view of a liquid-cooling heat dissipation plate according to a first embodiment of the present disclosure.
Figure 2:
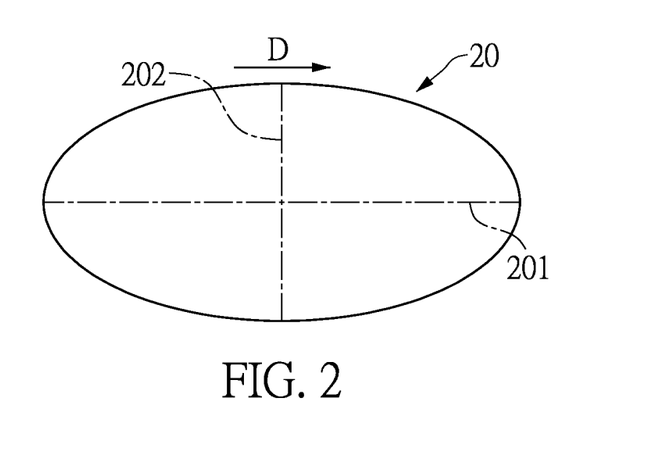
FIG. 2 is a bottom view of one pin-fin having a first shape of the present disclosure.
Figure 3:
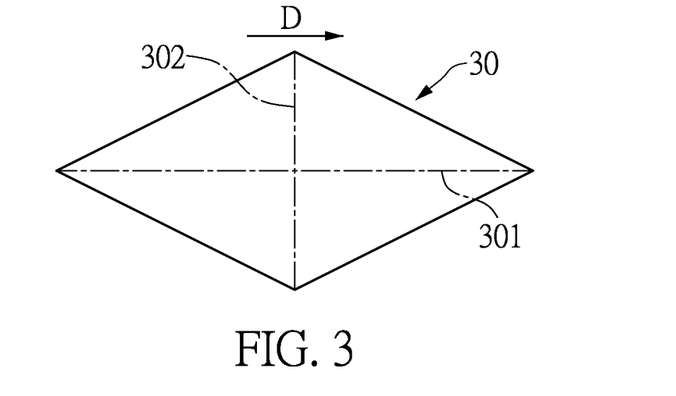
FIG. 3 is a bottom view of one pin-fin having a second shape of the present disclosure.

Referring to FIG. 1 to FIG. 3, a first embodiment of the present disclosure provides a liquid-cooling heat dissipation plate with unequal height pin-fins (hereinafter also referred to as a liquid-cooling heat dissipation plate 100 for brevity) for being disposed above a bottom wall of an enclosed or open cooler 900. As shown in FIG. 1, in this embodiment of the present disclosure, the liquid-cooling heat dissipation plate with unequal height pin-fins includes a heat dissipation plate body 10, a plurality of full-height pin-fins 20, and a plurality of non-full-height pin-fins 30.

In this embodiment, the heat dissipation plate body 10 can be made of a material having high thermal conductivity, such as copper, copper alloy, aluminum, or aluminum alloy. The heat dissipation plate body 10 has a first heat dissipation surface 11 and a second heat dissipation surface 12 that face away from each other, the first heat dissipation surface 11 is configured to be in contact with a plurality of heat sources by thermal compression bonding, and the second heat dissipation surface 12 is configured to be in contact with a cooling fluid.

In this embodiment, the plurality of full-height pin-fins 20 and the plurality of non-full-height pin-fins 30 are formed at the second heat dissipation surface 12 of the heat dissipation plate body 10. In addition, the plurality of full-height pin-fins 20, the plurality of non-full-height pin-fins 30, and the heat dissipation plate body 10 can be integrally connected (i.e., integrally formed) by metal injection molding, so as to have material continuity.

Figure 4:
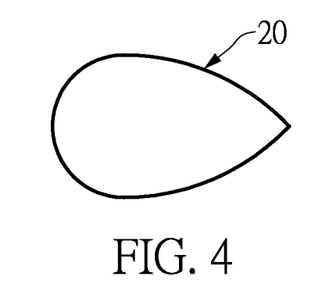
FIG. 4 is a bottom view of one pin-fin having a third shape of the present disclosure.
Figure 5:
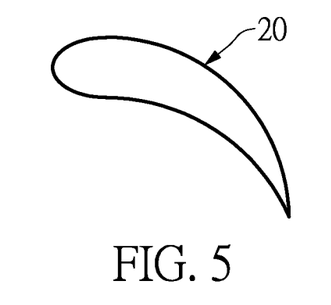
FIG. 5 is a bottom view of one pin-fin having a fourth shape of the present disclosure.
Figure 6:
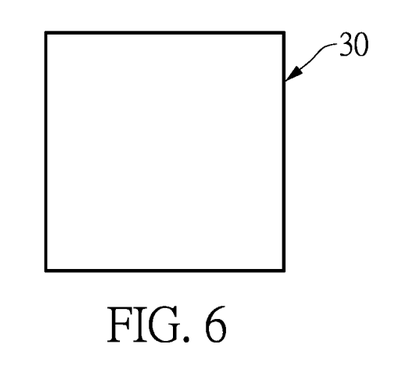
FIG. 6 is a bottom view of one pin-fin having a fifth shape of the present disclosure.

Furthermore, cross-sections of the plurality of full-height pin-fins 20 and the plurality of non-full-height pin-fins 30 can respectively be round-shaped, ellipse-shaped, rhombus-shaped, rectangle-shaped, drop-shaped, wing-shaped, or in other shapes. The cross-section of each of the plurality of full-height pin-fins 20 can be ellipse-shaped, and the cross-section of each of the plurality of non-full-height pin-fins 30 can be rhombus-shaped. As shown in FIG. 2, the cross-section of each of the plurality of full-height pin-fins 20 can have a major axis 201 and a minor axis 202 defined thereon, and the major axis is required to be parallel with a flowing direction D of the cooling fluid. As shown in FIG. 3, the cross-section of each of the plurality of non-full-height pin-fins 30 can have two diagonals 301 and 302 defined thereon, and a longer diagonal 301 of the two diagonals 301 and 302 is required to be parallel with the flowing direction D of the cooling fluid. In other embodiments, as shown in FIG. 4 and FIG. 5, a cross-section of each of the plurality of full-height pin-fins 20 can be drop-shaped or wing-shaped. In addition, as shown in FIG. 6, a cross-section of each of the plurality of non-full-height pin-fins 30 can be rectangle-shaped.

In this embodiment, a first heat dissipation region to an Nth heat dissipation region are defined on the heat dissipation plate body 10 along the flowing direction D of the cooling fluid, in which N is an integer greater than or equal to two, and the plurality of heat sources respectively correspond in position to the first heat dissipation region to the Nth heat dissipation region.

Moreover, in this embodiment, the first heat dissipation region and a second heat dissipation region (a first heat dissipation region A1 and a second heat dissipation region A2) are defined on the heat dissipation plate body 10 along the flowing direction D of the cooling fluid, and two heat sources (a first automotive chip C1 and a second automotive chip C2) respectively correspond in position to the first heat dissipation region A1 and the second heat dissipation region A2. That is, the flowing direction D of the cooling fluid is a direction from the first automotive chip C1 toward the second automotive chip C2. A power of the first automotive chip C1 can be the same or different from a power of the second automotive chip C2. Because the flowing direction D of the cooling fluid is the direction from the first automotive chip C1 toward the second automotive chip C2, a fluid temperature when the cooling fluid flows to a position corresponding to the first automotive chip C1 is lower, and a fluid temperature when the cooling fluid absorbs heat and flows to a position corresponding to the second automotive chip C2 is higher. Accordingly, pin-fins having a greater height and a lesser height can be used to promote the first heat dissipation region A1 and the second heat dissipation region A2 to have similar heat dissipation effects. However, when chips are bonded to the heat dissipation plate body 10 through thermal compression bonding, the pin-fins having the lesser height may be incapable of withstanding a downward pressure F that is applied thereon.

In this embodiment, the plurality of non-full-height pin-fins 30 can be pin-fins having a height that is half of that of the full-height pin-fins 20, that is, the plurality of non-full-height pin-fins 30 can be a plurality of half-height pin-fins 30a. Naturally, the plurality of non-full-height pin-fins 30 can have a height that is between half of the height and the height of the full-height pin-fins 20, and the present disclosure is not limited thereto. A ratio of the plurality of non-full-height pin-fins 30 to pin-fins in the first heat dissipation region A1 is fifty percent, and a ratio of the plurality of full-height pin-fins 20 to the pin-fins in the first heat dissipation region A1 is fifty percent. Accordingly, in a region in which the temperature of the cooling fluid is lower, that is, in an inlet region (also referred to as a first fifty percent of heat dissipation regions from the first heat dissipation region A1 to the second heat dissipation region A2), fifty percent of pin-fins are the plurality of half-height pin-fins 30a as heat dissipation fins, and another fifty percent of the pin-fins of the inlet region are the plurality of full-height pin-fins 20 as supporting fins. In a region in which the temperature of the cooling fluid is higher, that is, in an outlet region (i.e., the second heat dissipation region A2), at least ninety-five percent and up to one hundred percent of pin-fins are the plurality of full-height pin-fins 20 as heat dissipation fins and supporting fins. Therefore, an excessive pressure drop does not occur in the overall heat dissipation plate, and an operating energy consumption of a liquid pump can be prevented from being increased. Furthermore, when chips are bonded to the heat dissipation plate body 10 in thermal compression bonding, an issue of the pin-fins having the lesser height being incapable of withstanding a downward pressure F that is applied thereon can be avoided.

Second Embodiment

Figure 7:
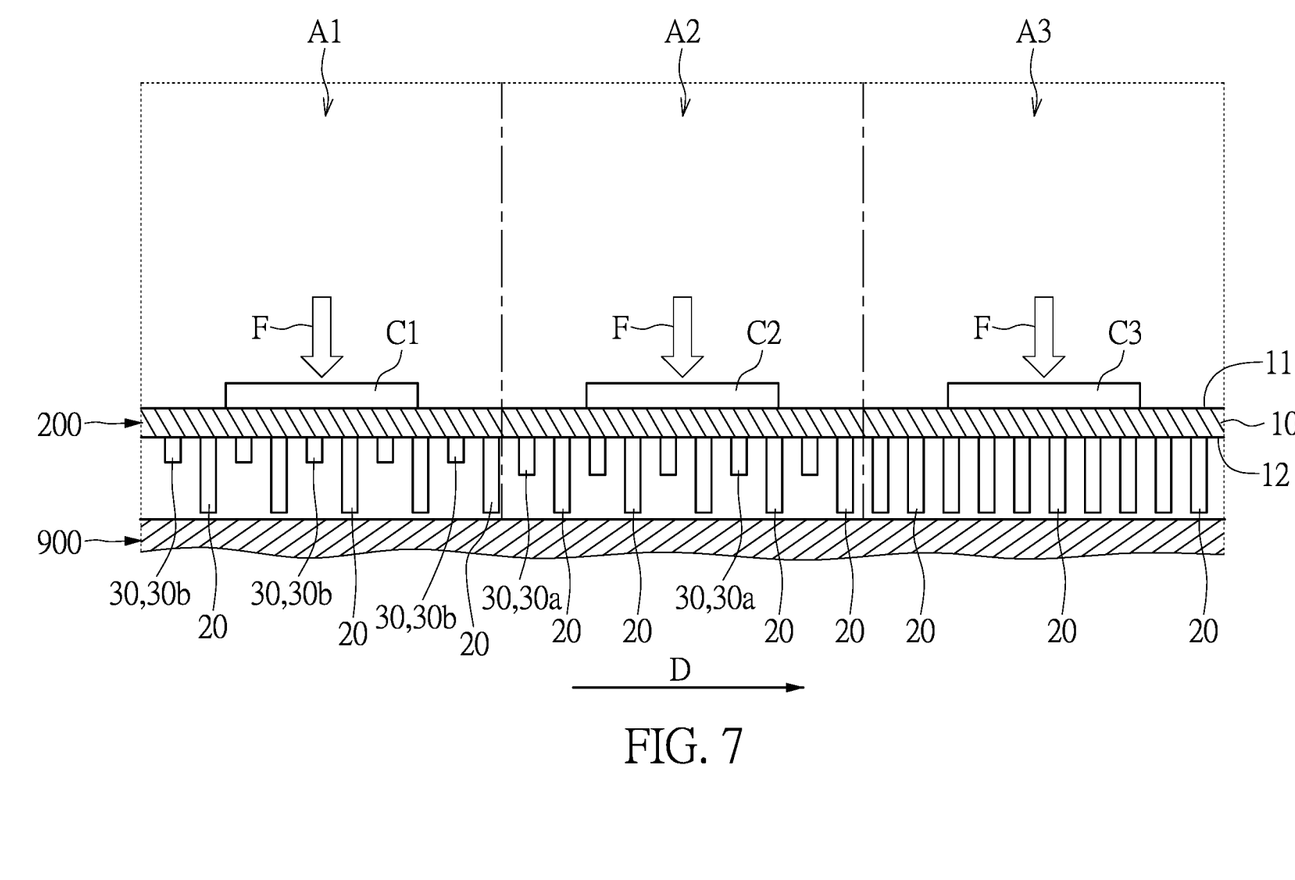
FIG. 7 is a schematic side view of a liquid-cooling heat dissipation plate according to a second embodiment of the present disclosure.

Referring to FIG. 7, a second embodiment of the present disclosure is substantially the same as the first embodiment, and the difference therebetween is described as follows.

In this embodiment, a liquid-cooling heat dissipation plate with unequal height pin-fins (referred to as a liquid-cooling heat dissipation plate 200 for brevity) is provided. A first heat dissipation region, a second heat dissipation region, and a third heat dissipation region (a first heat dissipation region A1, a second heat dissipation region A2, and a third heat dissipation region A3) are defined on the heat dissipation plate body 10 along the flowing direction D of the cooling fluid, and three heat sources (a first automotive chip C1, a second automotive chip C2, and a third automotive chip C3) respectively correspond in position to the first heat dissipation region A1, the second heat dissipation region A2, and the third heat dissipation region A3. That is, the flowing direction D of the cooling fluid is a direction from the first automotive chip C1 to the second automotive chip C2 and toward the third automotive chip C3. A power of the first automotive chip C1, a power of the second automotive chip C2, and a power of the third automotive chip C3 can be the same or different from each other. Because the flowing direction D of the cooling fluid is the direction from the first automotive chip C1 to the second automotive chip C2 and toward the third automotive chip C3, a fluid temperature when the cooling fluid flows to a position corresponding to the first automotive chip C1 is lower, and a fluid temperature when the cooling fluid absorbs heat and flows to a position corresponding to the third automotive chip C3 is the highest.

Therefore, in this embodiment, the plurality of non-full-height pin-fins 30 can be pin-fins having a height that is one-third of that of the full-height pin-fins 20, that is, the plurality of non-full-height pin-fins 30 can be a plurality of one-third-height pin-fins 30b. A ratio of the plurality of non-full-height pin-fins 30 to pin-fins in the first heat dissipation region A1 is fifty percent, and a ratio of the plurality of full-height pin-fins 20 to the pin-fins in the first heat dissipation region A1 is fifty percent. A ratio of the plurality of non-full-height pin-fins 30 (i.e., the half-height pin-fins 30a having half of the height of the height of the full-height pin-fins 20) to pin-fins in the second heat dissipation region A2 is fifty percent, and a ratio of the plurality of full-height pin-fins 20 to the pin-fins in the second heat dissipation region A2 is fifty percent. A ratio of the plurality of full-height pin-fins 20 to the pin-fins in the third heat dissipation region A3 is one hundred percent. Accordingly, in a region in which the temperature of the cooling fluid is lower, that is, in an inlet region, fifty percent of pin-fins are the plurality of one-third-height pin-fins 30b as heat dissipation fins, and another fifty percent of the pin-fins of the inlet region are the plurality of full-height pin-fins 20 as supporting fins. In a region (a transition region) where a temperature of the cooling fluid is a second highest temperature, that is, in an inlet region, fifty percent of pin-fins are the plurality of half-height pin-fins 30a as heat dissipation fins, and another fifty percent of the pin-fins of the inlet region are the plurality of full-height pin-fins 20 as supporting fins. In a region where the temperature of the cooling fluid is the highest temperature, that is, in an outlet region, nearly one hundred percent of pin-fins are the plurality of full-height pin-fins 20 as heat dissipation fins and supporting fins.

Accordingly, a ratio of the full-height pin-fins 20 to the pin-fins in a first fifty percent of a plurality of heat dissipation regions needs to be lower than a ratio of the full-height pin-fins 20 to the pin-fins in a second fifty percent of the plurality of heat dissipation regions. Therefore, a pressure drop of the overall heat dissipation plate can be maintained in an appropriate range, and when chips are bonded to the heat dissipation plate body 10 in thermal compression bonding, an issue of the pin-fins having the lesser height being incapable of withstanding a downward pressure F that is applied thereon can be avoided.

Third Embodiment

Figure 8:
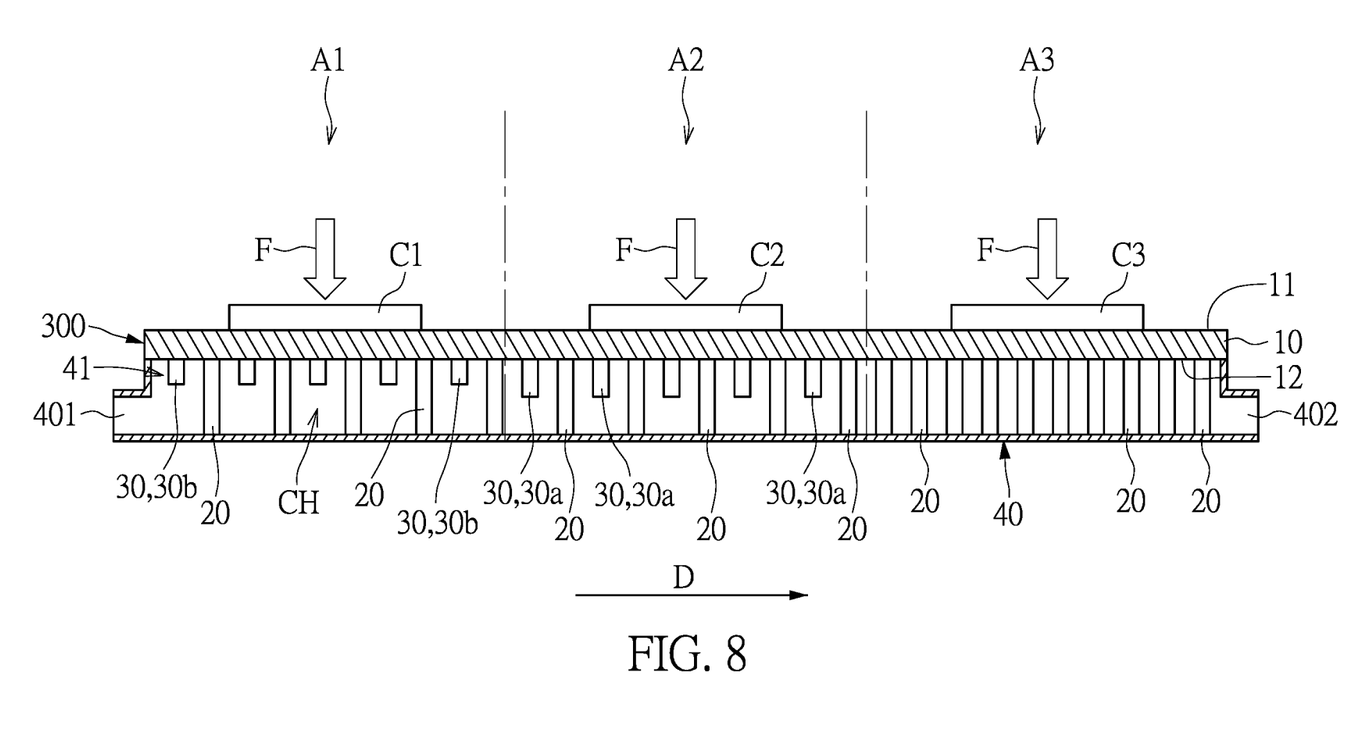
FIG. 8 is a schematic side view of an enclosed liquid-cooling cooler according to a third embodiment of the present disclosure.

Referring to FIG. 8, a third embodiment of the present disclosure is substantially the same as the second embodiment, and the difference therebetween is described as follows.

In this embodiment, an enclosed liquid-cooling cooler 300 is provided. Furthermore, the enclosed liquid-cooling cooler 300 includes the liquid-cooling heat dissipation plate with unequal height pin-fins of any of the aforementioned embodiments, and further includes a heat dissipation base 40. In this embodiment, a groove 41 is recessed from the heat dissipation base 40, the heat dissipation base 40 is combined with the heat dissipation plate body 10 so that a chamber CH is formed between the groove 41 of the heat dissipation base 40 and the second heat dissipation surface 12 of the heat dissipation plate body 10, such that the plurality of full-height pin-fins 20 and the plurality of non-full-height pin-fins 30 are located in the chamber CH. Furthermore, one end of each of the full-height pin-fins 20 can be integrally formed on the second heat dissipation surface 12 of the heat dissipation plate body 10, and another end of each of the full-height pin-fins 20 can abut against a bottom wall of the groove 41. Moreover, an inlet through hole 401 and an outlet through hole 402 can be respectively connected to the chamber CH, so that the cooling fluid can flow into the chamber CH via the inlet through hole 401 and out of the chamber CH via the outlet through hole 402, thereby further improving a heat dissipation effect by using the enclosed fluid circulation loop.

Beneficial Effects of the Embodiments

In conclusion, in the a liquid-cooling heat dissipation plate with unequal height pin-fins, by technical solutions of "a liquid-cooling heat dissipation plate including a heat dissipation plate body, a plurality of full-height pin-fins, and a plurality of non-full-height pin-fins," "the heat dissipation plate body having a first heat dissipation surface and a second heat dissipation surface that face away from each other, the first heat dissipation surface being configured to be in contact with a plurality of heat sources, and the second heat dissipation surface being configured to be in contact with a cooling fluid," "the plurality of full-height pin-fins and the plurality of non-full-height pin-fins being formed at the second heat dissipation surface of the heat dissipation plate body, and a first heat dissipation region to an Nth heat dissipation region being defined on the heat dissipation plate body along a flowing direction of the cooling fluid," and "the plurality of heat sources respectively corresponding in position to the first heat dissipation region to the Nth heat dissipation region, and a ratio of the plurality of full-height pin-fins to pin-fins in a first fifty percent of heat dissipation regions from the first heat dissipation region to the Nth heat dissipation region being less than a ratio of the plurality of full-height pin-fins to pin-fins in a second fifty percent of the heat dissipation regions from the first heat dissipation region to the Nth heat dissipation region," an excessive pressure drop does not occur in the overall heat dissipation plate, a uniform heat dissipation effect can be achieved, and an issue of the pin-fins having the lesser height being incapable of withstanding a downward pressure F that is applied thereon can be avoided.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A liquid-cooling heat dissipation plate with unequal height pin-fins, comprising:
   a heat dissipation plate body having a first heat dissipation surface and a second heat dissipation surface that face away from each other, wherein the first heat dissipation surface is configured to be in contact with a plurality of heat sources, and the second heat dissipation surface is configured to be in contact with a cooling fluid;
   a plurality of full-height pin-fins formed at the second heat dissipation surface of the heat dissipation plate body; and
   a plurality of non-full-height pin-fins formed at the second heat dissipation surface of the heat dissipation plate body;
   wherein a first heat dissipation region to an Nth heat dissipation region are defined on the heat dissipation plate body along a flowing direction of the cooling fluid, N is an integer greater than or equal to two, and the plurality of heat sources correspond in position to the first heat dissipation region to the Nth heat dissipation region, respectively;
   wherein a ratio of the plurality of full-height pin-fins to pin-fins in a first fifty percent of heat dissipation regions from the first heat dissipation region to the Nth heat dissipation region is less than a ratio of the plurality of full-height pin-fins to pin-fins in a second fifty percent of the heat dissipation regions from the first heat dissipation region to the Nth heat dissipation region.

2. The liquid-cooling heat dissipation plate according to claim 1, wherein the plurality of full-height pin-fins, the plurality of non-full-height pin-fins, and the heat dissipation plate body are made of copper, copper alloy, aluminum, or aluminum alloy.

3. The liquid-cooling heat dissipation plate according to claim 1, wherein cross-sections of the plurality of full-height pin-fins and the plurality of non-full-height pin-fins can respectively be round-shaped, ellipse-shaped, rhombus-shaped, rectangle-shaped, drop-shaped, or wing-shaped.

4. The liquid-cooling heat dissipation plate according to claim 1, wherein a ratio of the plurality of full-height pin-fins to pin-fins in the first heat dissipation region is at least 35%, and a ratio of the plurality of full-height pin-fins to pin-fins in the Nth heat dissipation region is at least 95%.

5. An enclosed liquid-cooling cooler, comprising the liquid-cooling heat dissipation plate as claimed in claim 1, and a heat dissipation base, wherein a groove is recessed in the heat dissipation base, the heat dissipation base is combined with the heat dissipation plate body so that a chamber is formed between the groove of the heat dissipation base and the second heat dissipation surface of the heat dissipation plate body, such that the plurality of full-height pin-fins and the plurality of non-full-height pin-fins are located in the chamber.

* * * * *